United States Patent [19]

Langner et al.

[11] Patent Number: 4,820,927

[45] Date of Patent: Apr. 11, 1989

[54] ELECTRON BEAM SOURCE EMPLOYING A PHOTO-EMITTER CATHODE

[75] Inventors: Guenther O. Langner, Westford; Kenneth J. Harte, Carlisle, both of Mass.

[73] Assignee: Control Data Corporation, Minneapolis, Minn.

[21] Appl. No.: 97,408

[22] Filed: Sep. 15, 1987

Related U.S. Application Data

[63] Continuation of Ser. No. 750,102, Jun. 28, 1985, abandoned.

[51] Int. Cl.$^4$ ............................................. H01J 27/02
[52] U.S. Cl. .................................. 250/492.2; 250/310; 250/423 R; 250/396 R; 313/542; 313/544
[58] Field of Search ............. 250/492.24, 492.2, 492.3, 250/396 R, 398, 310, 423 R; 313/542, 544

[56] References Cited

U.S. PATENT DOCUMENTS

| | | | |
|---|---|---|---|
| 3,243,570 | 3/1966 | Boring | 250/398 |
| 3,617,686 | 11/1971 | Dietrich et al. | 250/398 |
| 4,039,810 | 8/1977 | Heritage | 250/492.2 |
| 4,066,905 | 1/1978 | Dassler et al. | 250/396 R |
| 4,227,090 | 10/1980 | Amboss | 250/492.2 |
| 4,460,831 | 7/1984 | Oettinger et al. | 250/492.2 |

FOREIGN PATENT DOCUMENTS 0143326 8/1984 Japan ............................... 250/492.2

Primary Examiner—Carolyn E. Fields
Assistant Examiner—John A. Miller
Attorney, Agent, or Firm—Charles W. Helzer; Ira C. Edell; Robert M. Angus

[57] ABSTRACT

A scanned electron beam system employs an electron beam source using an NEA activated photo-emitter as the cathode. The activated photo-emitter cathode produces a pre-shaped electron beam having a relatively small spot focussed on a target plane. The beam is selectively deflected to scan the beam spot along the target plane to expose desired patterns on that plane. The distance between the cathode and anode can be made large enough to accommodate in situ replenishment of cathode material, such as Cesium, without obstructing the electron optical path. The system includes two vacuum chambers which are differentially pumped through respective ports. The first chamber, in which the anode and cathode are located, is utilized for establishing the required electrostatic field. The second chamber is employed to produce the necessary focussing and selective beam deflection.

11 Claims, 2 Drawing Sheets

ELECTRON BEAM SOURCE EMPLOYING A PHOTO-EMITTER CATHODE

This application is a continuation, of application Ser. No. 06/750,102, filed June 28, 1985, now abandoned.

TECHNICAL FIELD

The present invention relates to scanned electron beam systems wherein a relatively small beam spot is scanned across a target plane. More particularly, the present invention relates to improvements in forming an electron beam suitable for use in scanned electron beam systems.

BACKGROUND OF THE INVENTION

Scanned electron beam columns are utilized in a variety of applications, including scanning electron microscopes, electron beam lithography, and electron beam inspection systems, etc. The electron beam source of the present invention was developed primarily for utilization in an electron beam lithography system in which one or more beams are selectively deflected to directly write circuit patterns on a semiconductor wafer located in a target plane. Such systems are described and illustrated, for example, in U.S. Pat. Nos. 4,390,789 (Smith et al) and 4,110,622 (Trotel); and in co-pending U.S. patent application Ser. No. 06/749,796, filed concurrently herewith and entitled "Multiple Channel Electron Beam Optical Column Lithography System And Method Of Operation" by Kenneth J. Harte. The disclosures in these patents and patent application are expressly incorporated herein in their entirety by this reference. Although the present invention was developed primarily with electron beam lithography systems in mind, it is to be understood that the invention has applicability in substantially all scanned electron beam systems wherein a relatively small beam spot is scanned or selectively deflected across a target plane.

Conventional electron beam guns utilized in scanned beam systems employ thermionic cathodes as the source of electrons. Thermionic cathodes are heated to the required temperature, generally by means of a connected filament through which a high current is passed to effect electron emission. In spite of their wide use, numerous disadvantages are associated with thermionic cathodes. Specifically, such cathodes are characterized by a low efficiency, with only one percent or less of the total emission current being utilized at the target. The emission current must therefore be quite high in order to provide a reasonable current at the beam spot location. This results in significant heating of stripping apertures along the beam column, thereby creating thermal expansion problems and requiring long warm-up times. In addition, the high emission current results in relatively high energy spread from electron-to-electron interactions, thereby creating lens and deflector chromatic aberrations. Moreover, the high emission current inherently creates a large number of backscatter or secondary electrons, thereby disposing a significant number of free electrons in the column during blanking of the beam. Consequently, there is significant contamination by cross-linked residual hydrocarbons, resulting in charging and unstable operation.

In addition to their low efficiency, thermionic cathodes are characterized by non-uniform current density across the beam, resulting in uneven effects produced across the beam spot area in the target plane. Further, beam blanking by the required electron optical means is relatively complex and is characterized by a relatively long transition time.

It is known in the prior art to employ a photoemitter cathode (or photocathode) as a beam source to expose a large area pattern on a target plane. Examples of systems of this type may be found in U.S. Pat. Nos. 4,039,810 (Heritage) and 4,227,090 (Amboss). These systems provide a large photocathode which emits a beam shaped to the desired circuit pattern in its entirety. The photocathode is irradiated by a light source through a mask bearing the features of the desired circuit pattern; alternatively, the emissions from the photocathode are optically projected by a reticle. The entire emission pattern is then electron-optically imaged onto the target. This approach has certain disadvantages, including the need to change the photocathode assembly, or the mask, in order to change the pattern to be exposed. In addition, from the electron-optical point of view, it is difficult to image relatively wide or large fields with uniform resolution across the entire field. Moreover, relatively large diameter lenses are required to effect the required focusing.

OBJECTS AND SUMMARY OF THE INVENTION

It is therefore an object of the present invention to provide an improved scanned electron beam system employing an electron beam source by means of which the aforementioned disadvantages of thermionic cathodes are eliminated.

It is another object of the present invention to provide an improved scanned electron beam system employing a photocathode beam source in a manner which avoids the aforementioned disadvantages of photocathode beam sources.

It is a further object of the present invention to provide an improved electron beam system having an electron beam source which produces a relatively small beam spot that can be selectively scanned or displaced along a target surface.

Still another object of the present invention is to provide a scanned electron beam system having an improved electron beam source which is many times more efficient than thermionic cathode sources, which produces uniform current density across a relatively small beam spot, which operates at relatively low temperatures and which has extremely short blanking times.

In accordance with the present invention, a scanned electron beam system employs an electron beam source using an NEA (negative electron affinity) Cs,O activated photo emitter as the cathode. This source is particularly suitable for shaped spot electron beam columns, such as used in electron beam lithography, scanning electron microscopes, etc. The cathode system utilizes a diode laser or light emitting diode (LED) focussed on the cathode emitting surface through a transparent window which is part of the wall of a vacuum chamber in which an anode is disposed. The distance between the cathode and anode can be made large enough to accommodate in situ replenishment of the Cesium required for the cathode without obstructing the electron optical path. The electron beam source includes two vacuum chambers which are differentially pumped through respective ports. The first chamber, in which the anode and cathode are located, is utilized for establishing the required electrostatic field. The second chamber is employed to produce the necessary focussing and selective deflection of the beam. The size and shape of the emitting area of the photocathode can be selected so that, in conjunction with the focussing and deflection capabilities of the system, the desired spot size and shape can be projected for virtually all system needs.

The resulting electron beam source using the photocathode emitter has the following advantageous characteristics: a high uniformity of emission current density; relatively high brightness due to the low radial moment of the emitted electrons; selectability of the size and shape of the emitting area over a wide range, either by means of illumination or by physically masking the emitting window; operability at room temperature, or below when cooled, thereby avoiding thermal instability and thermal expansion problems; and controlability of external emission by means of controlling the diode laser or LED current, thereby permitting high speed blanking and unblanking of the beam.

BRIEF DESCRIPTION OF THE DRAWINGS

These and other objects, features and many of the attendant advantages of the present invention will be appreciated more readily as these become better understood from a reading of the following detailed description, considered in connection with the accompanying drawings wherein like parts in each of the several figures are identified by the same reference characters, and wherein.

DESCRIPTION OF THE PREFERRED EMBODIMENTS

Figure 1:
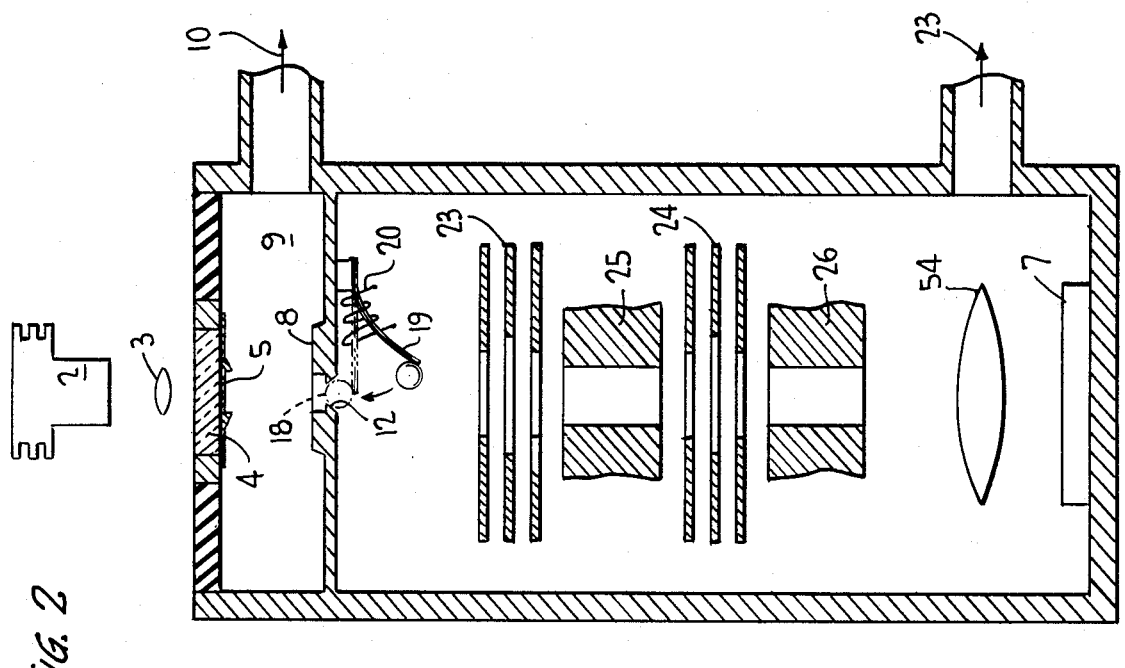
FIG. 1 is a diagrammatic illustration of an electron beam source and system according to the present invention employing a photoemitter cathode utilizing an imaging length for the emitting surface with the beam waist in a rear focal plane as the illuminating source.

Referring specifically to FIG. 1 of the accompanying drawings, an electron beam source and system is schematically illustrated and includes a housing subdivided into two vacuum chambers 9 and 11 by a wall 13. A photoemitter cathode assembly 1 is disposed at the upstream end of chamber 9 and includes a light energy source 2, a lens 3, a transparent window 4 which is part of the end wall of chamber 9, and an electron emitting cathode surface 5. The photoemitter cathode assembly 1 is conventional and does not, in itself, constitute part of the present invention other than its relationship to the method for defining the size and shape of the emitting cathode surface 5. The light source 2 is either a diode laser or LED which illuminates the semi-transparent semiconductor photo-emitter 5 through the transparent window 4. Lens 3 may be employed to improve the illumination of the photo-emitter 5; alternatively, or in addition, fiber optics (not shown) may be utilized for this purpose.

The two vacuum chambers 9 and 11 are differentially pumped by separate pumps connected at exhaust ports 10 and 23 defined through the housing wall in communication with the respective chambers. Communication between the chambers is provided by means of an aperture 12 defined through wall 13. In order to protect the emitter 5, particularly its Cesium surface, against higher pressure and poisoning gas species which may be required for use in vacuum chamber 11, a ball valve 18 is mounted on a bi-metal leaf spring 19 which is selectively actuated by a heating element 20 to close aperture 12 completely. Elements 18 and 19 are shown in the open position of the valve by means of solid lines in FIG. 1; dashed lines indicate the closed valve position. The photo-emitter cathode is used in a diode gun configuration. The distance between cathode 5 and anode 8 may be made sufficiently large to accommodate means for in situ replenishment of the Cesium without obstructing the electron optical path.

An electrostatic einzel lens is disposed in chamber 9 and includes the gun anode 8 as its entrance plate. A central plate 14 for the einzel lens is disposed intermediate anode 8 and the chamber wall 13 which corresponds to the exit plate for the lens. The einzel lens formed by plates 8, 13 and 14 images the virtual cathode into a first spot-shaping aperture 15 forming the entrance to an electron optical focussing and deflection system 16. System 16 positions and focusses the electron beam pencil 6 on a target 7 located at the downstream end of chamber 11. System 16 is conventional and may be magnetic, electrostatic or hybrid. The only properties of this system which have any bearing on the inventive nature of the subject beam source are the maximum size b (see FIG. 3) of the focussed spot in the target plane, the semi-angle $\alpha_1$ of a pencil 6 and the size a of the first spot-shaping aperture 15.

Figure 3:
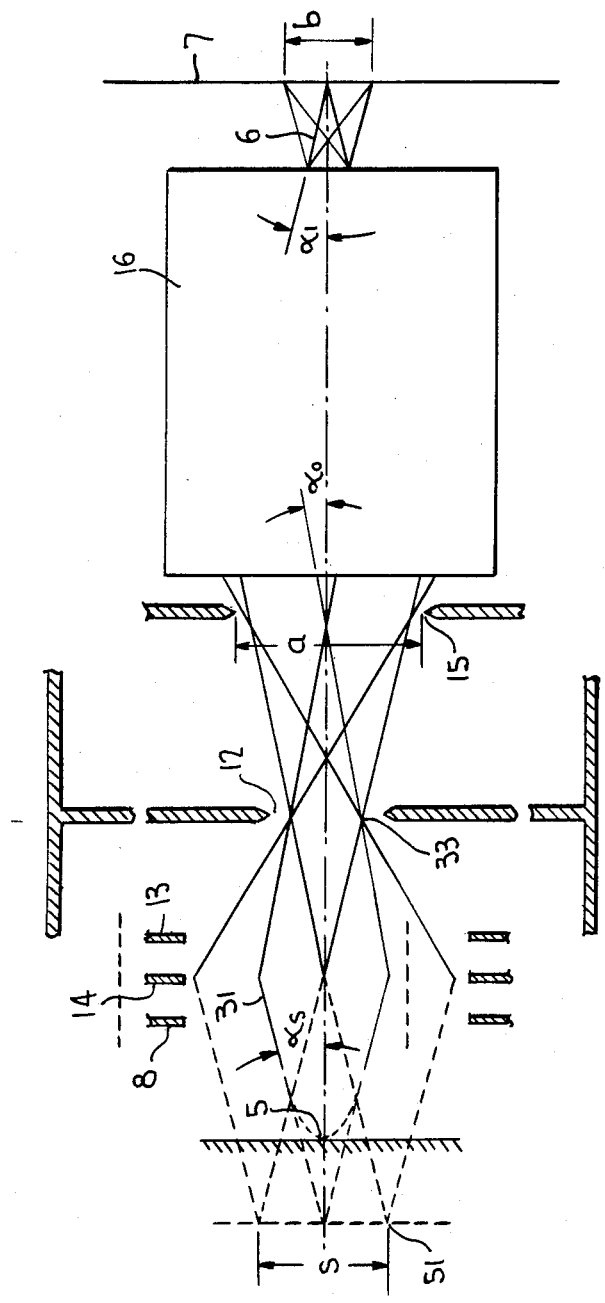
FIG. 3 is a schematic diagram of the principal trajectories in the system illustrated in FIG. 1.

Referring to FIG. 3 of the accompanying drawings, this figure illustrates schematically the principal electron trajectories and is employed herein to describe the method for defining the size s of the emitting area of the cathode, the positioning of the separating aperture 12 for the differentially pumped chambers 9 and 11, and the interfacing of the disclosed source and electron optical system 16. In a diode gun the trajectories of all electrons emitted from one point of cathode 5 are parabolic in nature. Parabola 31, with the widest opening, relates to the electrons having maximum radial energy. For photo-emitter cathodes this maximum radial energy is limited and quite small. Tangents to the parabolae at the anode aperture position (i.e., at the opening in entrance plate 8 of the einzel lens) where no further acceleration takes place, extended toward the cathode, intersect in a virtual cathode plane 51 located upstream of the cathode 5. Conical pencils appear to emerge from each point on this virtual cathode. The semi-angle $\alpha_s$ of these cones is determined by electrons with maximum radial energy.

The electron optical system is operated utilizing the so called Koehler illumination scheme characterized by imaging the source crossover into the final projection lens. The maximum semi-angle obtainable for pencil 6 is given by the radius of this crossover image divided by the working distance of the final lens. As a practical matter, the crossover image is truncated by a physical aperture in order to reduce the semi-angle by a truncation factor p, where p is less than 1. The truncation produces the value $\alpha_1$ which is an optimum compromise between aberrations (edgewidth of the spot) and current density in the spot which is proportional to $\alpha_1^2$. Due to the truncation a fraction q(having a value less than one) of the beam current is utilized in the target.

If the size of the full spot in target plane 7 is denoted by b, then the size of the emitting area of the cathode s must be equal to or greater than $b\alpha_1/p\alpha_s$. This follows according to well known laws of optics (Rayleigh-Helmholtz law). For a typical example, for $\alpha_s=2.5\times10^{-3}$, $\alpha_1=7.5\times10^{-3}$, p=0.8, b=5 micrometers, then s is equal to or greater than 18.75 micrometers.

Accounting for imperfect imaging of the cathode area by the source lens, and for beam jitter and other noise, s may be chosen somewhat greater than $b\alpha_1/p\alpha_s$ by a factor t which is greater than 1. Beam utilization, namely the ratio of the current into the beam spot and the emission current, is then given by $q/t^2$, and can reach a value of twenty percent or more. The source lens 8, 13, 14 performs two functions. Specifically, the einzel lens images the virtual cathode into the first spot-shaping aperture 15 of the electron optical focussing and deflection system 16 and provides the crossover acting as the source in the Koehler illumination scheme. The magnification M of the source lens is provided by at/s, where a is the size of the first spot-shaping aperture 15. This requires that the distance between the center plate 14 of the source lens and the first spot-shaping aperture 15 is M times the distance between the central plate 14 of the einzel lens and the virtual cathode, this distance being equal to twice the distance between anode 8 and cathode 5. The einzel lens for the source is designed such that its exit plate 13 terminates in the differential pumping aperture 12 and that its rear focal plane 33 is located within this aperture. This rear focal plane 33 represents the crossover in the Koehler illumination scheme. The beam cross-section is minimized at this crossover, thereby permitting the separation aperture 12 to be made very small. For example, if $\alpha_s$ is equal to $2.5\times10^{-3}$, and the focal length of the source lens is 0.5 inches, and the diameter of the beam cross-section is 0.0025 inches, a practical size for aperture 12 is 0.003 inches.

The system illustrated in FIG. 1 also includes beam steerers (i.e., four-fold deflectors) 21 and 22 which permit alignment of the imaging beam onto the aperture 15 and in the direction of the optical axis of the electron optical focussing and deflection system 16.

Figure 2:
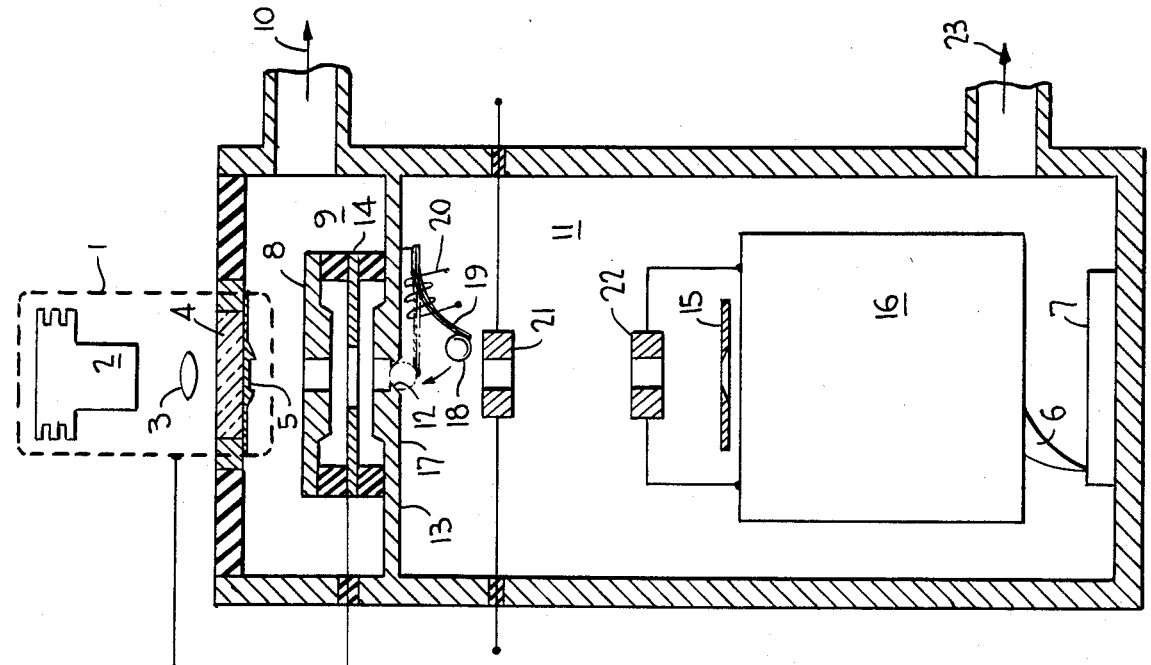
FIG. 2 is a diagrammatic illustration of another electron beam source and system according to the present invention employing a photocathode utilizing the virtual cathode as the illuminating source.

Referring now to FIG. 2 of the accompanying drawings, illustrated therein is an electron beam source and system employing a photo-emitter cathode using the virtual cathode as the illuminating source. Elements common to the embodiments illustrated in FIGS. 1 and 2 utilize the same reference numerals. It is noted that the source lens 8, 13 and 14 for the embodiment of FIG. 1 is omitted in the embodiment of FIG. 2. The virtual cathode represents the illuminating source in the Koehler illumination scheme.

Figure 4:
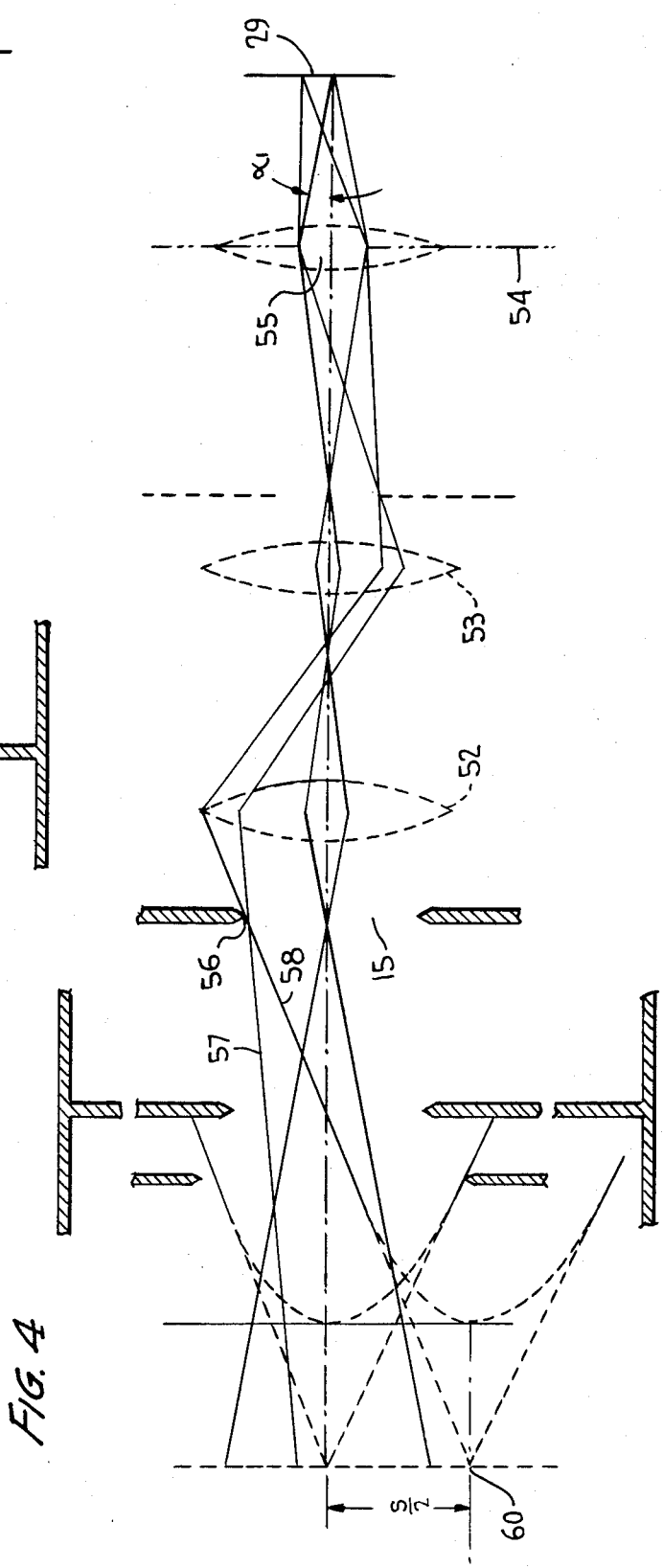
FIG. 4 is a schematic diagram of the principal trajectories in the system illustrated in FIG. 2.

Considering the trajectory diagram of FIG. 4 in conjunction with the system illustrated in FIG. 2, the trajectories originating from the actual cathode 51 are parabolic in form. As explained above with reference to the diagram in FIG. 3, straight trajectories (dashed lines) originate at the virtual cathode 51. The size of the emitting area is s, with half of the emitting area size, s/2 being denoted in FIG. 4. This size is determined by the following considerations.

The electron optical system, which produces a focussed spot 29 in the target plane, is symbolically represented by lenses 52, 53 and 54. These three lenses represent the minimum number of lenses required for a variable imaged aperture system. The lenses may be magnetic or electrostatic. Using the Koehler illumination scheme, the source (i.e., the virtual cathode 51, for the system of FIG. 2) is imaged into the principal plane of the final lens 54. The semi-angle $\alpha_1$ of the pencil 6 forming the final image 29 is considered to be a system parameter and imposes the condition that the radius of the source image 55 in the principal plane of the final lens 54 must be moderately greater than the working distance multiplied by $\alpha_1$. The first imaged spot-shaping aperture 15 is illuminated as a consequence of the current density distribution of the beam emerging from the electron gun. Considering an edge point 56 of the imaged aperture 15, the bundle delineated by the trajectories 57 and 58 has an opening angle dictated by the semi-angle $\alpha_1$ at the target, namely moderately greater than $\alpha_1$ multiplied by the size of final image 29 and divided by the size of the imaged aperture 15. The steeper of the two trajectories, namely trajectory 58, intersects the virtual cathode plane 51 at point 60 and determines the size s of the emitting area.

The key advantage of the source illustrated in FIGS. 2 and 4 is that the number of crossovers, and consequently the electron-to-electron interaction, is reduced, thereby resulting in an increased brightness and reduced energy spread.

The description and illustration of the trajectories is based on an electron optical system as used for variable spot-shaping. This electron optical system utilizes electrostatic lenses 23 and 24 and spot-shaping deflectors 25 and 26. Lens 54 is the final lens used to produce the focussed shape spot at target 7.

The anode 8 illustrated in the embodiment of FIG. 2 contains an aperture 12 which separates the two differentially pumped vacuum chambers 9 and 11. It is noted, however, that the anode 8 is not part of an einzel lens such as is employed in the embodiment of FIG. 1; rather, anode 8 in the FIG. 2 embodiment is formed as part of the wall separating the two chambers 9 and 11.

It has been verified by testing that a pressure difference of an order of magnitude can be maintained across aperture 12. It is feasible to operate the photo-emitter cathode in the $10^{-9}$ Torr range.

Although the beam steerers 21, 22 are not illustrated in the FIG. 2 embodiment, these are typically included in any high resolution electron optical system.

The electron beam source of the present invention is an advance over the prior art in many respects. First of all, the source utilizes up to twenty percent of the emission current of the focussed beam in the target, in contrast to one percent or less achieved by sources using thermionic emitters with materials such as lanthanum hexaboride, or tungsten in typical shaped electron lithography tools. This permits a much lower emission current to be utilized in the photocathode beam source than is required for the thermionic cathode source. Lowering the emission current by a factor of twenty has three main benefits. First, lower electron beam heating of the stripping apertures occurs, thereby reducing or eliminating one significant source of warm-up and thermal expansion problems. Second, a lower energy spread is effected from electron-to-electron interactions in the gun (Boersch effect), thereby reducing lens and deflector chromatic aberrations. Third, the number of backscattered or secondary electrons in the system is greatly reduced. In particular, there are no free electrons during blanking of the beam. Consequently there is less contamination by cross-link residual hydrocarbons, leading to reduced charging and stable operation of the column over a longer period of time.

The high brightness achieved in conjunction with the selectable source size makes it possible to achieve a high current density in the shaped spot in an electron beam exposure tool, thereby resulting in a high throughput. Further, the elimination of electron optical means for effecting beam blanking results in a far simpler system. Specifically, the diode laser or LED controls external emission. This means that blanking and unblanking can be effected by activating and deactivating the diode lazed or LED. Using this technique, high speed blanking and unblanking can be obtained (i.e., on the order of nanoseconds).

The electron beam source of the present invention is characterized by a high uniformity of the emission current density, and a high brightness due to the low radial moment of the emitted electrons. The size and shape of the emitting area of the cathode are selectable over a wide range, either by means of illuminating the cathode selectively or by masking the emitting window. The source of the present invention is capable of operation at room temperature or below (when cooled), thereby avoiding thermal instability and thermal expansion problems.

Having described several embodiments of an electron beam source employing a photo-emitter cathode according to the present invention, it is believed obvious that other modifications and variations of the invention will be suggested to those skilled in the art in light of the above teachings. It is therefore to be understood that changes may be made in the particular embodiments of the invention described, which changes are within the full intended scope of the invention defined by the appended claims.

What is claimed is:

1. An electron beam system for exposing at least one target area in a target plane to a beam spot focused in the target plane, said system comprising:
    diode gun emitter means for emitting a beam of electrons in parabolic trajectories, said diode gun emitter means comprising a source of light energy and a photocathode responsive to said light energy for emitting said electrons from an emitter surface of said photo-cathode;
    an apertured anode through which the emitted electrons pass, the tangents to the parabolic trajectories at said anode intersecting in a virtual cathode plane from which the electrons appear to emerge as generally conical beam pencils having a first semi-angle $\alpha_1$;
    wherein said apertured anode includes a spot-shaping aperture through which the electrons pass in passing through said apertured anode;
    focusing means for focusing said electrons passing through said spot-shaping aperture into a plurality of converging beam pencils converging at the target plane at a second semi-angle $\alpha_s$ within a beam spot area in said target plane, said beam spot area having a dimension b defined by said spot-shaping aperture and said focusing means;
    area-defining means for selectively defining an electron-emitting area portion of said emitter surface such that electrons are emitted only from said electron-emitting area, said electron-emitting area having at least one selectable dimension s corresponding to the dimension b of said beam spot area and established equal to or greater than $t(b\alpha_1/p\alpha_s)$,
    wherein p is a truncation factor having a value less than one by which said beam pencils are truncated to define $\alpha_1$, and t is a compensation factor greater than one accounting for imperfect imaging, beam jitter and noise;
    whereby current density and uniformity of the combination of said electrons at said target plane, within said beam spot area, are maximized by reduced electron-to-electron interaction.

2. The system according to claim 1 further comprising;
    a housing sub-divided into first and second vacuum chambers by a dividing wall oriented transverse to said beam, said first chamber having a transparent window therein, said photocathode being located inside said first chamber adjacent said window, said source being located outside said first chamber and oriented to illuminate said photocathode through said window, wherein said dividing wall has a communication aperture defined therethrough aligned with said window and said photocathode and smaller in size than the widest part of said beam within said first chamber.

3. The system according to claim 2 further comprising lens means for concentrating said beam in said first chamber to permit the beam to pass substantially completely through said communication aperture into said second chamber;
    wherein said focusing means comprises electron optical focusing and deflection means disposed in said second chamber for selectively focusing said beam on said target plane and selectively positioning said beam spot in said target plane.

4. The system according to claim 3 wherein said lens means is an einzel lens having a beam entrance plate comprising said apertured anode and a beam exit plate corresponding to at least a portion of said dividing wall.

5. The system according to claim 2 further comprising:
    means for differentially pumping said first and second chambers to create effective vacuum operating pressure conditions therein.

6. The system according to claim 2 further comprising means for selectively blocking and unblocking said communication aperture.

7. The system according to claim 1 wherein said area defining means comprises means for masking said photocathode to permit electron emission only from said electron-emitting area.

8. The system according to claim 1 wherein said area defining means comprises means for selectively illuminating only portions of said photocathode corresponding to said electron-emitting area.

9. The system according to claim 1 wherein said area-defining means comprises means for defining said electron-emitting area such that a minimum of approximately twenty percent of emitted beam current is delivered to the beam spot.

10. A method for exposing at least one target area in a target plane to a beam spot focused in the target plane, said method comprising the steps of:
    emitting a beam of electrons in parabolic trajectories from an electron-emitting area of a photocathode emitter surface;
    passing the emitted electrons through an apertured anode such that the tangents to the parabolic trajectories at said anode intersect in a virtual cathode plane from which the electrons appear to emerge as generally conical beam pencils having a first semi-angle $\alpha_s$, said apertured anode including a spot-shaping aperture and wherein said step of passing includes passing the electrons through the spot-shaping aperture;

focusing the electrons passing through said spot-shaping aperture into a plurality of converging beam pencils converging at the target plane at a second semi-angle $\alpha_1$ within a beam spot area in said target plane, said beam spot area having a dimension b defined by said spot-shaping aperture and said focusing;

selectively defining said electron-emitting area with at least one selectable dimension s corresponding to the dimension b of said beam spot area and established equal to or greater than $t(b\alpha_1/p\alpha_s)$, wherein p is a truncation factor having a value less than one by which said beam pencils are truncated to define $\alpha_1$, and t is a compensation factor greater than one accounting for imperfect imaging, beam jitter and noise;

whereby current density and uniformly of the combination of said electrons at said target plane, within said beam spot area, is maximized by reduced electron-to-electron interaction.

11. The method according to claim 10 wherein the step of selectively defining includes defining the electron-emitting area such that a minimum of approximately twenty percent of the emitted beam current is received at the target spot.

* * * * *